(12) United States Patent
Soh

(10) Patent No.: US 7,250,316 B2
(45) Date of Patent: Jul. 31, 2007

(54) MASK AND METHOD OF MANUFACTURING LIQUID CRYSTAL DISPLAY DEVICE USING THE SAME

(75) Inventor: Jae-Moon Soh, Gyeongsangbuk-Do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 155 days.

(21) Appl. No.: 11/022,650

(22) Filed: Dec. 28, 2004

(65) Prior Publication Data
US 2005/0142681 A1    Jun. 30, 2005

(30) Foreign Application Priority Data
Dec. 29, 2003   (KR)   .................. 10-2003-0099378

(51) Int. Cl.
*H01L 21/00* (2006.01)
(52) U.S. Cl. ............... 438/30; 438/149; 257/E29.151; 257/E51.005
(58) Field of Classification Search ............. 438/30, 438/149, 151–153, 158, 689, 911, 942, 949, 438/48
See application file for complete search history.

(56) References Cited

U.S. PATENT DOCUMENTS

| 6,057,065 | A | 5/2000 | Rolson |
| 6,534,246 | B2 | 3/2003 | Bae |
| 6,586,286 | B2 * | 7/2003 | Park et al. .................. 438/155 |
| 2002/0021403 | A1 | 2/2002 | Kim et al. |

* cited by examiner

*Primary Examiner*—Quoc Hoang
(74) *Attorney, Agent, or Firm*—McKenna Long & Aldridge LLP

(57) ABSTRACT

A method for fabricating a device is disclosed. The method includes providing a substrate; forming a thin film on the substrate; forming a photoresistable layer on the thin film; irradiating light onto the photoresistable layer through a photo mask having a transmissive region, a semi-transmissive region, a diffractive region and an interceptive region, and developing the photoresistable layer to form a photoresist pattern having at least three different thicknesses. With the above-described process, a liquid crystal display device (LCD), for example, can be manufactured using three photo masks.

5 Claims, 6 Drawing Sheets

MASK AND METHOD OF MANUFACTURING LIQUID CRYSTAL DISPLAY DEVICE USING THE SAME

This application claims the benefit of Korean Patent Application No. 2003-99378, filed on Dec. 29, 2003, which is hereby incorporated by reference for all purposes as if fully set forth herein.

BACKGROUND OF THE INVENTION

1. Field of the Invention

The present invention relates to a liquid crystal display device (LCD), and more particularly, to a mask including an optical absorption layer and a diffraction pattern and a method of manufacturing an LCD using the same that simplifies the manufacturing process thereof.

2. Discussion of the Related Art

Liquid crystal display devices (LCD) that are a type of transmissive flat panel display devices (FPD) are mainly applied to portable electronic apparatuses such as notebook computers, personal digital assistants (PDA) and mobile telephones, and are diffusively applied to high definition televisions (HDTV), digital televisions and thin wall-mounted televisions. In general, various kinds of FPDs such as plasma display panels (PDP), vacuum fluorescent displays (VFD) and field emission displays (FED), together with the above-described LCDs, are actively under study. However, due to such advantages as productivity, driving facility and high picture quality, the LCDs are mainly used.

The LCD is a device that displays information on a screen using refractive index anisotropy of liquid crystal. In general, liquid crystal is provided between a lower substrate on which a driving device is formed and an upper substrate on which a color filter is formed to form a liquid crystal layer. The molecules of the liquid crystal layer are driven by the driving device to control the amount of light that transmits the liquid crystal layer, thereby displaying information on the screen. Among various kinds of LCDs, a thin film transistor (TFT) LCD in which TFTs are used as the driving device is mainly used.

The TFT is formed in each of the pixels of an LCD to independently control the pixels. Such an LCD is manufactured by complicated processes including a photolithography process which requires a photo mask. Therefore, simplification of the manufacturing process is a main concern in reducing the manufacturing cost and improving the yield. As a result, significant efforts have been made in order to simplify the manufacturing process. At the beginning, eight masks had been used to manufacture a TFT-LCD. However, a seven or six mask process was introduced to simplify the manufacturing process, and, recently, a five mask process has been mainly employed to manufacture a TFT-LCD.

FIGS. 1A to 1E illustrate a five mask process to manufacture an LCD according to a related art. A method of manufacturing an LCD will be described in detail with reference to FIGS. 1A to 1E.

First, as illustrated in FIG. 1A, a gate electrode 11 made of metal is formed on a transparent first substrate 10 such as glass. More specifically, after forming a metal layer on the entire substrate 10, the metal layer is coated with photoresist. Then, the photoresist is developed using a first mask, and an etching process is performed to form the gate electrode 11. A gate insulating film 16 is, then, formed on the first substrate 10 on which the gate electrode 11 is formed.

Next, as illustrated in FIG. 1B, a semiconductor material such as amorphous silicon (a-Si) is formed on the gate insulating layer 16 and is etched using a second mask to form a semiconductor layer 13.

Next, as illustrated in FIG. 1C, source/drain electrodes 15 are formed on the semiconductor layer 13. More specifically, after forming a metal layer on the entire semiconductor layer 13 and gate insulating layer 16, the metal layer is coated with photoresist. Then, the photoresist is developed using a third mask, and an etching process is performed to form the source/drain electrodes 15. Although not shown in the drawing, an ohmic contact layer that is an impurity layer is formed between the semiconductor layer 13 and the source/drain electrodes 15.

Next, as illustrated in FIG. 1D, after forming a passivation layer 17 on the entire first substrate 10, a contact hole 18 is formed in the passivation layer 17 using a fourth mask.

Then, as illustrated in FIG. 1E, a transparent electrode such as indium tin oxide (ITO) is formed on the passivation layer 17 and is etched using a fifth mask such that a pixel electrode 19 is formed on the passivation layer 17. At this time, the pixel electrode 19 is connected to the drain electrode 15 through the contact hole 18 formed in the passivation layer 17.

On the other hand, a black matrix 22 and a color filter layer 24 are formed on a second substrate 20, the first substrate 10 and the second substrate 20 are attached to each other, and a liquid crystal layer 30 is provided between the first substrate 10 and the second substrate 20 to complete an LCD.

As described above, the related art method requires five masks for manufacturing an LCD: a mask for the gate electrode, a mask for the semiconductor layer, a mask for the source/drain electrodes, a mask for the contact hole and a mask for the pixel electrode.

Referring to FIG. 2, the above-described five-mask LCD manufacturing process generally uses a mask 40 having a transmissive region and an interceptive region. The interceptive region that blocks light includes metal patterns 42 formed on a substrate 41. The metal patterns are generally formed of metal such as Cr, and quartz is generally used for the substrate 41 for high transmittance. By irradiating light onto a photoresist layer through such a mask and then developing the phtoresist layer, a desired pattern is formed.

Although not shown in the drawings, a photolithography process using a mask is so complicated that the manufacturing cost of an LCD increases and the yield decreases. Therefore, active efforts in reducing the number of a photolithography process have been made.

SUMMARY OF THE INVENTION

Accordingly, the present invention is directed to a method for manufacturing a liquid crystal display (LCD) device that substantially obviates one or more of the problems due to limitations and disadvantages of the related art.

An advantage of the present invention is to provide a mask having a transmissive region, a semi-transmissive region, a diffractive region and an interceptive region so that three patterns are formed by one process.

Another advantage of the present invention to provide a method for manufacturing a liquid crystal display (LCD) device using the mask that simplifies the manufacturing process thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a mask includes a transparent substrate; an optical absorption layer on the substrate; and a metal pattern on the substrate, the metal pattern including a plurality of slits.

In another aspect of the present invention, a method of manufacturing a liquid crystal display device includes forming a gate electrode in a pixel unit and a pad in a pad unit on a first substrate; depositing a gate insulating layer, a semiconductor layer, a metal layer, and a passivation layer over the first substrate; depositing a photoresist layer over the passivation layer; irradiating light onto the first substrate through a mask having a transmissive region, a half-transmissive region, a diffractive region and an interceptive region and developing the photoresist layer to form a photoresist pattern having at least three different thicknesses; first etching the gate insulating layer, the semiconductor layer, the metal layer, and the passivation layer over the pad to open the pad; first ashing the photoresist pattern and second etching the passivation layer and metal layer in the pad and pixel units; second ashing the photoresist pattern and third etching the passivation layer over the gate electrode; fourth etching the metal layer and a part of the semiconductor layer over the gate electrode to form source and drain electrodes; and forming a pixel electrode.

In yet another aspect of the present invention, a mask includes a transmissive region for transmitting light, a semi-transmissive region for partially transmitting light, an interceptive region for blocking light, and a diffractive region for diffracting light.

In still another aspect of the present invention, a method for fabricating a device includes providing a substrate; forming a thin film on the substrate; forming a photoresistable layer on the thin film; irradiating light onto the photoresistable layer through a photo mask having a transmissive region, a semi-transmissive region, a diffractive region and an interceptive region, and developing the photoresistable layer to form a photoresist pattern having at least three different thicknesses.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, example of which is illustrated in the accompanying drawings.

The present invention discloses a method for manufacturing a liquid crystal display device (LCD) that simplifies the manufacturing process thereof. In particular, according to the present invention, an LCD can be manufactured with three mask processes by employing a mask having a transmissive region, a semi-transmissive region, a diffractive region and an interceptive region. In other words, the five mask process of the related art can be replaced by a manufacturing method of the present invention, which has three mask processes or steps.

Figure 1A:
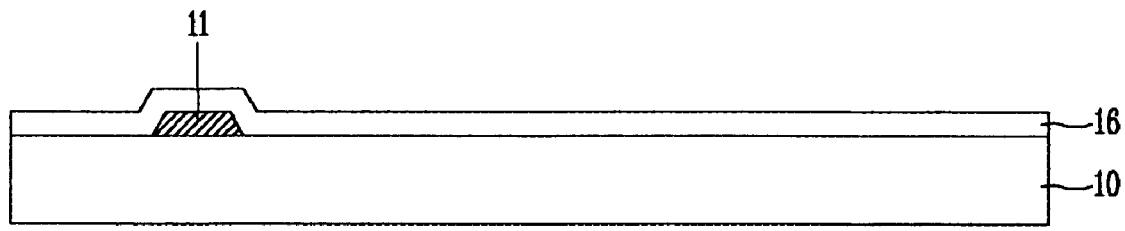
FIGS. 1A to 1E illustrate a five mask process to manufacture a liquid crystal display according to a related art.
Figure 1B:
Figure 1C:
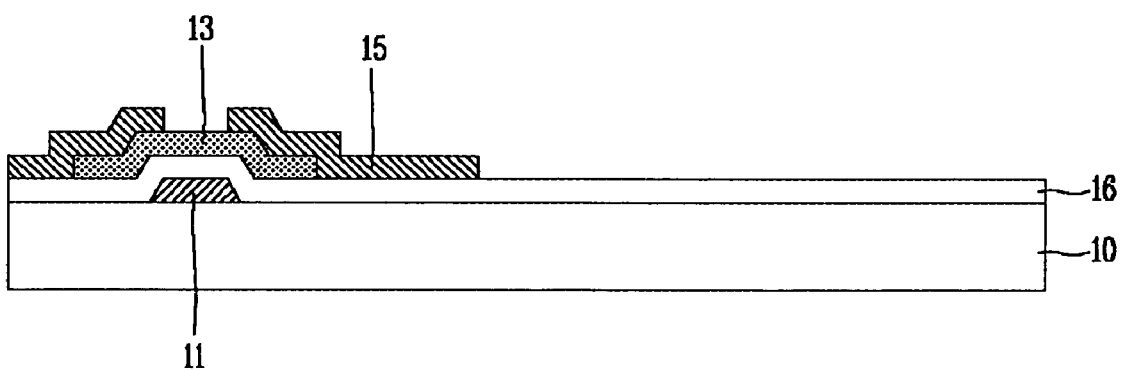
Figure 1D:
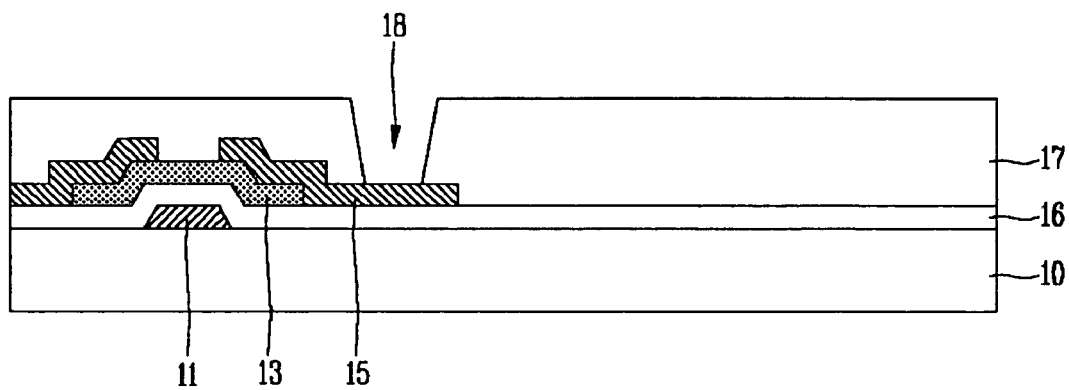
Figure 1E:
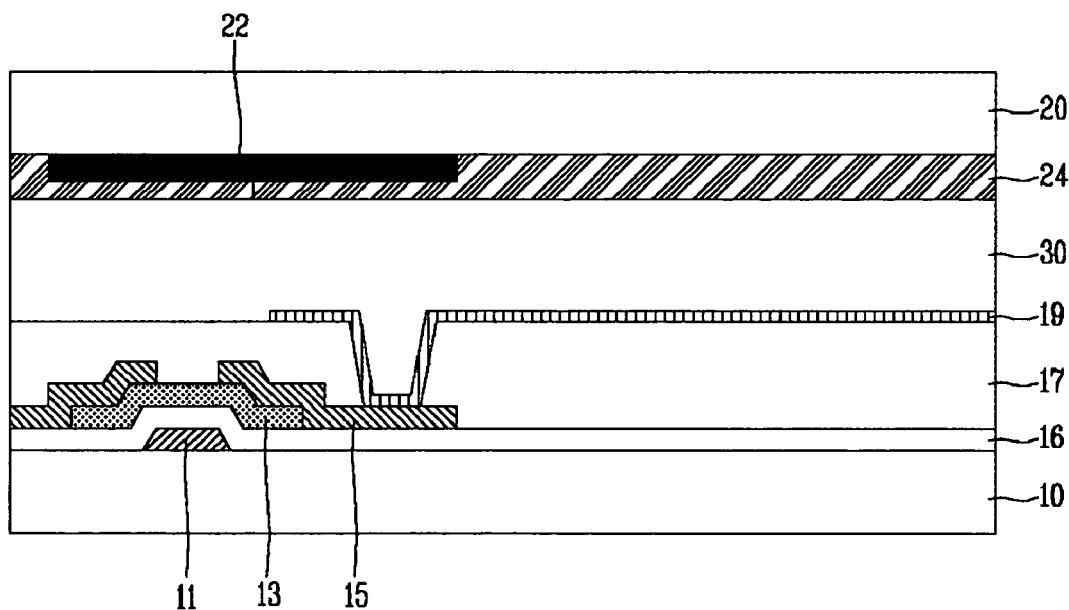
Figure 2:
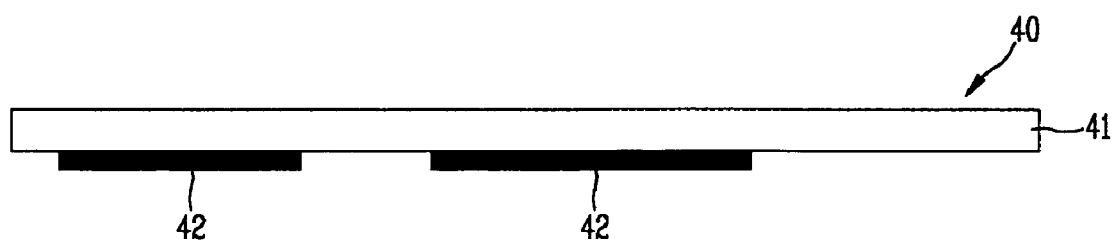
FIG. 2 illustrates the structure of a mask used for manufacturing the LCD in FIGS. 1A to 1E according to a related art.
Figure 3:
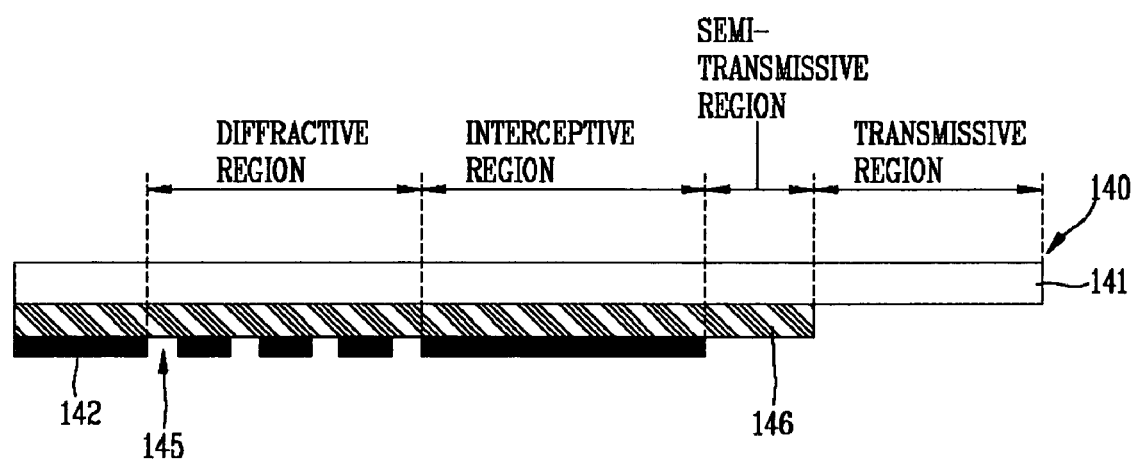
FIG. 3 illustrates the structure of a mask according to the present invention.

FIG. 3 illustrates a mask 140 according to the present invention. As illustrated in FIG. 3, the mask 140 includes a transparent substrate 141 such as quartz, an optical absorption layer 146 formed at a predetermined region of the substrate 141, and a metal pattern 142 formed at a predetermined region of the optical absorption layer 146. The optical absorption layer 146 is made of a material that absorbs light such as MoSi. The metal pattern 142 is made of metal such as Cr that has an excellent light intercepting characteristic. As illustrated in FIG. 3, a plurality of slits 145 are also formed in the metal pattern 142 to diffract incident light.

The mask 140 having the above-described structure may be divided into a plurality of regions in accordance with light transmission degrees. For example, the mask 140 includes a transmissive region in which the metal pattern 142 and the optical absorption layer 146 are not formed (that is, the region in which only the substrate exists), a semi-transmissive region in which only the optical absorption layer 146 is formed, an interceptive region in which the metal pattern 142 is formed, and a diffractive region in which the metal pattern 142 and the slits 145 are formed. The transmissive region transmits all incident light, and the semi-transmissive region transmits only part of incident light (for example, 35 to 55% of incident light). Also, the interceptive region blocks incident light because of the metal pattern 142, and the diffractive region diffracts incident light.

When a photoresist is exposed to light through the mask 140 and is developed, the photoresist pattern has three different thicknesses, because of the different regions in the mask 140. With this photoresist pattern having three different thicknesses, an LCD device can be manufactured using three mask processes or steps. Although the present invention is explained with an example of a manufacturing process for an LCD device, it should be appreciated that the principles of the present invention can be applicable to a manufacturing process for other devices that requires a photolithography process.

Hereinafter, a method for manufacturing an LCD device using the above-described mask will be described in detail with reference to attached drawings.

FIGS. 4A to 4H illustrate a method of manufacturing an LCD device according to the present invention. In the drawings, a pixel unit is separated from a pad unit for convenience sake.

Figure 4A:
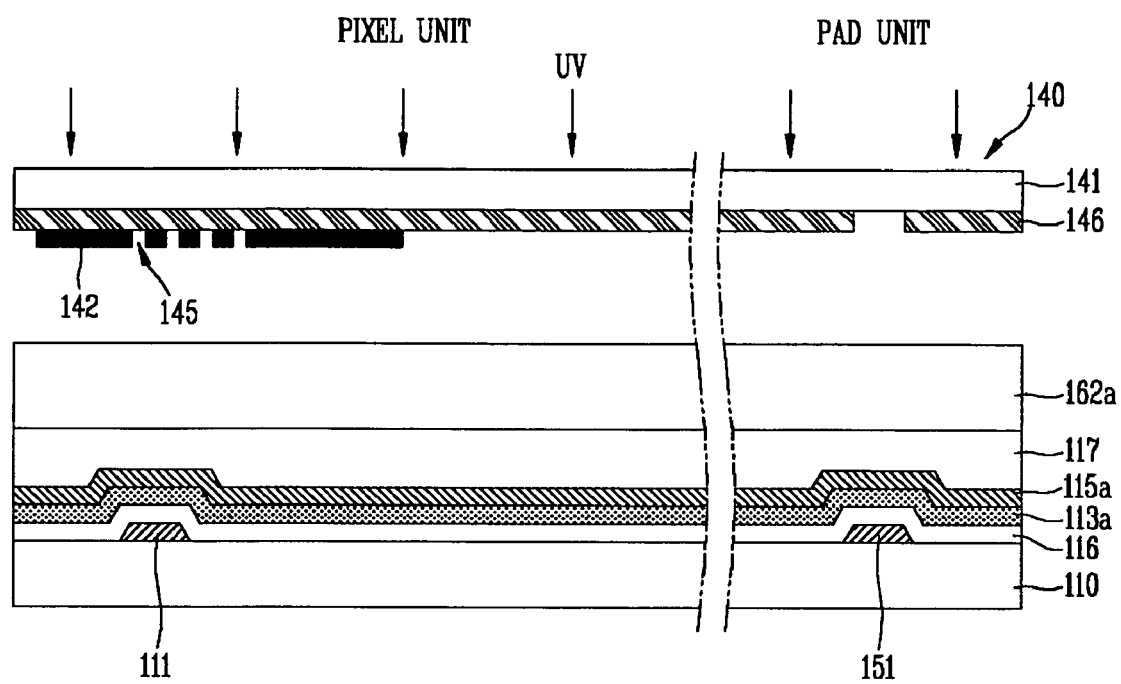
FIGS. 4A to 4H illustrate a method for manufacturing an LCD device according to the present invention.

First, as illustrated in FIG. 4A, after depositing metal such as Al, an Al alloy, and Cu on a transparent first substrate 110 such as glass by an evaporation method, a sputtering method, or the like, the metal layer is etched using a first mask to form a gate electrode 111 in the pixel unit and a pad 151 in the pad unit. Then, a gate insulating layer 116, a semiconductor layer 113a, a metal layer 115a, and a passivation layer 117 are continuously formed on the entire first substrate 110.

The gate insulating layer 116 is formed of an insulating material such as SiNx and SiOx. The semiconductor layer 113a further includes a undoped silicon layer formed of, for example, amorphous silicon (a-Si) or crystalline silicon and an impurity layer doped with impurity ions. Also, the metal layer 115a is formed by depositing metal such as Mo and an Mo alloy by an evaporation method, a sputtering method, or the like. The passivation layer 117 is formed of either an inorganic material such as SiNx and SiOx or an organic material such as benzocyclobutene (BCB) and photoacryl.

Figure 4B:
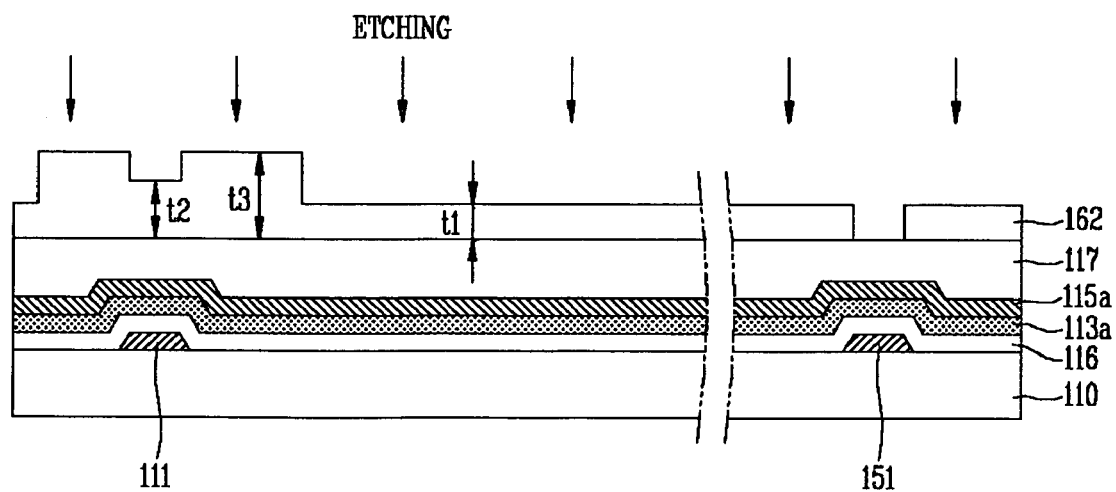

Next, as illustrated in FIG. 4B, a photoresist layer 162a is formed on the first substrate 110 on which the gate insulating layer 116, the semi conductor layer 113a, the metal layer 115a, and the passivation layer 117 are formed. Then, light such as ultraviolet (UV) rays is then irradiated onto the photoresist layer 162a through the mask 140, which has the transmissive region, the semi-transmissive region, the diffractive region and the interceptive region in accordance with the present invention. After the photoresist layer 162a is developed using a developer, a photoresist pattern 162 having different thicknesses is formed on the passivation layer 117. In this example, the transmissive region of the mask 140 is positioned over the pad 151 of the pad unit, and the diffractive region is positioned over the gate electrode 111. Also, the interceptive region is positioned at both sides of the diffractive region, and the semi-transmissive region is positioned in the pixel unit excluding the areas of the transmissive region and the interceptive region. During the developing process, the photoresist layer on the pad is removed, and the photoresist pattern 162 having the thicknesses of t1, t2, and t3 (t1<t2<t3) is formed on the passivation layer 117 of the pixel unit.

Figure 4C:
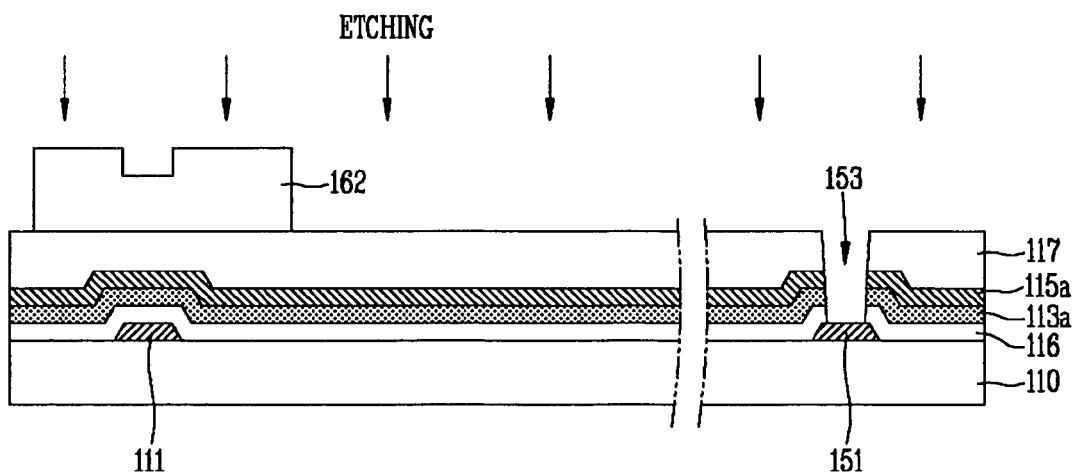

Next, when a dry-etching process is performed to remove the passivation layer 117, the metal layer 115a, and the gate insulating layer 116 on the pad 151, on which the photoresist pattern 162 is not formed, a contact hole 153, which is exposed to outside, is formed on the pad 151, as illustrated in FIG. 4C.

Next, an ashing process is performed using plasma ions to remove a predetermined portion or thickness of the photoresist pattern 162. As a result, only the photoresist pattern 162 over the gate electrode 111 and the photoresist pattern 162 at both sides of the gate electrode 111 in the pixel unit remains on the first substrate 110. Then, a dry-etching process is performed to remove the passivation layer 117 and the metal layer 115a of the pixel unit and the pad unit excluding the regions in which the photoresist pattern 162 remains on the first substrate 110. During the etching process, the metal layer 115a formed of Mo or an Mo alloy is removed, while the pad 151 formed of Al or an Al alloy, which is also exposed to the etching condition, is not affected by the dry etching process.

Figure 4D:
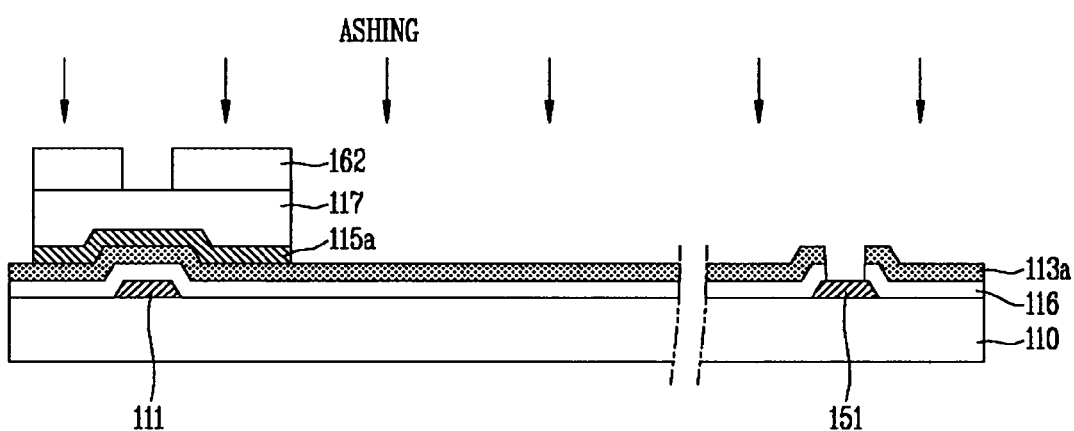
Figure 4E:
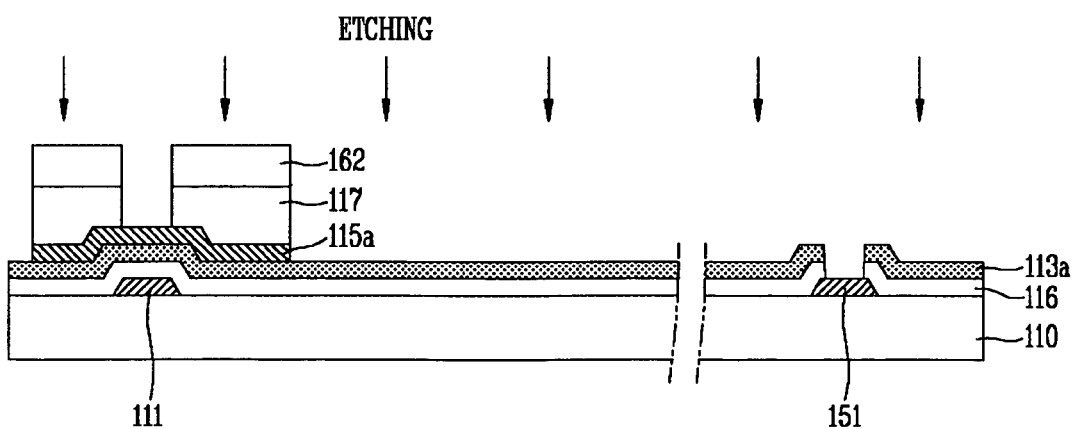
Figure 4F:
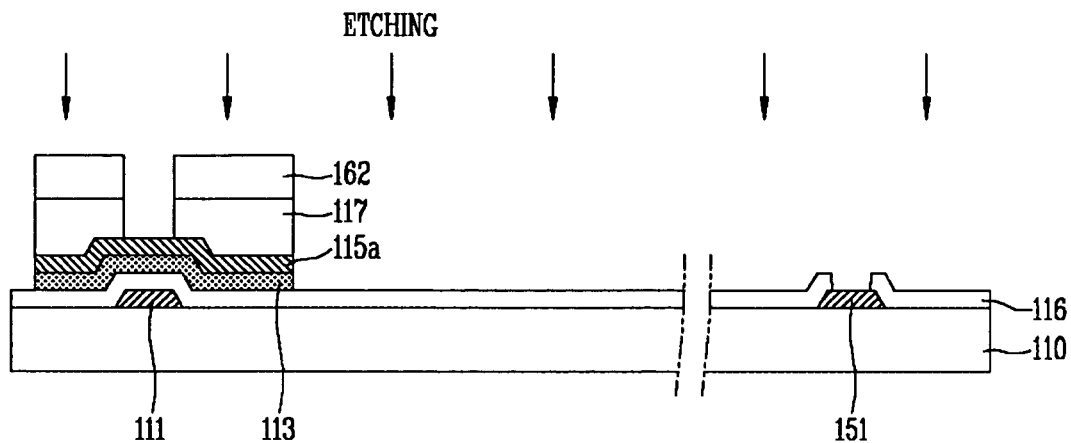
Figure 4G:
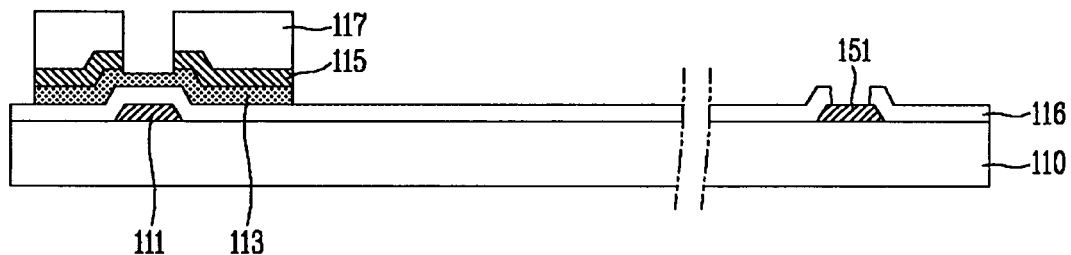

Next, another ashing process is performed to remove the photoresist pattern 162 over the gate electrode 111 such that only the photoresist pattern 162 at both sides of the gate electrode 111 remains on the first substrate 110, as illustrated in FIG. 4D. Then, a dry-etching process is performed to remove the passivation layer 117 on the gate electrode 111 to expose the metal layer 115a, as illustrated in FIG. 4E, and remove the semiconductor layer 113a of the pixel unit and the pad unit excluding the regions blocked by the metal layer 115a, as illustrated in FIG. 4F. Then, a dry-etching process is continuously performed to remove the metal layer 115a and part of the semiconductor layer 113 (that is, the ohmic contact layer) on the gate electrode 111, and then, the photoresist pattern 162 is removed, thereby forming source/drain electrodes 115, as illustrated in FIG. 4G. During the etching process, the metal layer 115a formed of Mo or an Mo alloy is removed, while the pad 151 formed of Al or an Al alloy, which is also exposed to the etching condition, is not affected by the dry etching process.

Figure 4H:
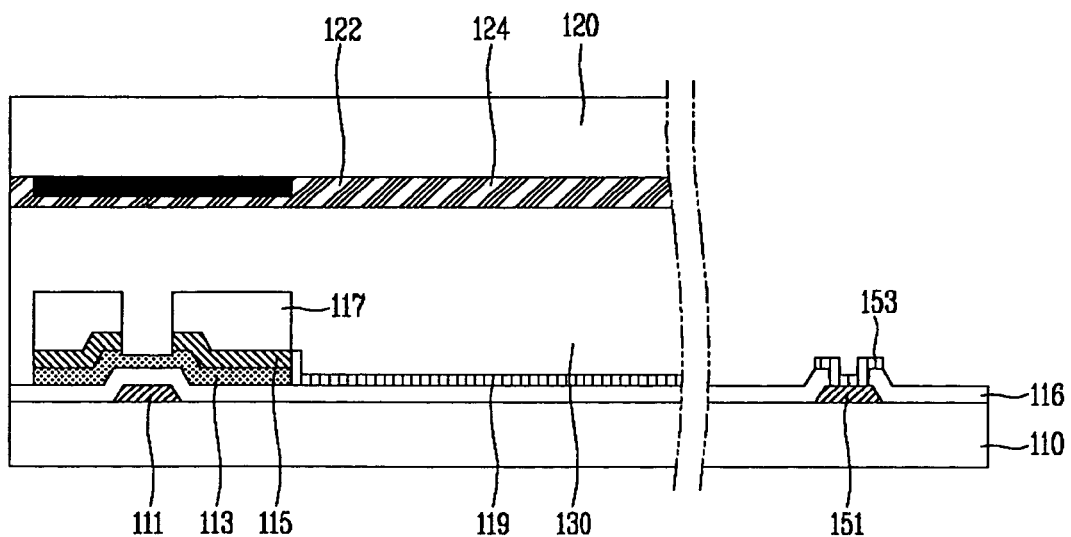

Then, as illustrated in FIG. 4H, after forming a transparent conductive layer such as indium tin oxide (ITO) or indium zinc oxide (IZO) on the entire first substrate 110, a photolithography process is performed using a third mask to a pixel electrode 119 in the pixel region and an oxidation preventing layer 153 on the pad 151 in the pad region. Because the source/drain electrodes 115 are formed of Mo or an Mo alloy, the source/drain electrodes 115 have an excellent side contact characteristic. Therefore, as illustrated in the drawing, the pixel electrode 119 can be connected to the side of the drain electrode 115.

On the other hand, Cr/CrOx or black resin is formed on the second substrate 120 to form a black matrix 122 for preventing light leakage, and a color filter layer 124 having red (R), green (G), and blue (B) layers is formed on the second substrate 120 for color implementation. Then, after the first substrate 110 and the second substrate 120 are attached to each other using sealant, a liquid crystal layer 130 is provided between the first substrate 110 and the second substrate 120 to complete a liquid crystal display.

As described above, according to the present invention, it is possible to manufacture an LCD device with three masks: a mask for the gate electrode, a mask for the semiconductor layer and the source/drain electrodes, and a mask for the pixel electrode. The second mask used for patterning the semiconductor layer and the source/drain electrodes has a transmissive region, a semi-transmissive region, a diffractive region and the interceptive region to differentiate the amount of light that passes through the second mask. Due to the different regions of the second mask, a photoresist pattern has various thicknesses. As a result, an LCD device can be manufactured by a three-mask process.

A photo mask according to the present invention is not only applicable to a manufacturing method for a TN-LCD device (typical LCD device), but is also applicable to other LCD devices, such as an in plane switching (IPS) mode LCD and a vertical alignment (VA) mode LCD. Further, the principles of the present invention can be applicable to a manufacturing process for other devices that requires a photolithography process.

As described above, according to the present invention, because an LCD device is manufactured with a photo mask having a transmissive region, a semi-transmissive region, a diffractive region and an interceptive region, it is possible to reduce the number masks and simplify the manufacturing process.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a liquid crystal display device, comprising:
  forming a gate electrode in a pixel unit and a pad in a pad unit on a first substrate;

depositing a gate insulating layer, a semiconductor layer, a metal layer, and a passivation layer over the first substrate;

depositing a photoresist layer over the passivation layer;

irradiating light onto the first substrate through a mask having a transmissive region, a half-transmissive region, a diffractive region and an interceptive region and developing the photoresist layer to form a photoresist pattern having at least three different thicknesses;

first etching the gate insulating layer, the semiconductor layer, the metal layer, and the passivation layer over the pad to open the pad;

first ashing the photoresist pattern and second etching the passivation layer and metal layer in the pad and pixel units;

second ashing the photoresist pattern and third etching the passivation layer over the gate electrode;

fourth etching the metal layer and a part of the semiconductor layer over the gate electrode to form source and drain electrodes; and forming a pixel electrode.

2. The method according to claim 1, wherein the metal layer is formed of Mo or an Mo alloy.

3. The method according to claim 2, wherein the metal layer is etched by a dry etching.

4. The method according to claim 2, wherein the pixel electrode is connected to a side portion of the drain electrode.

5. The method according to claim 1, wherein the method of manufacturing a liquid crystal display device uses three photo masks.

* * * * *